(12) United States Patent
Hsu et al.

(10) Patent No.: US 7,367,725 B2
(45) Date of Patent: May 6, 2008

(54) METHOD FOR REMOVING DEVELOPING SOLUTION

(75) Inventors: Wen-Cheng Hsu, Miao-Li (TW); Ching-Lung Wang, Miao-Li (TW); Yu-Ying Chan, Miao-Li (TW); Tseng-Kuei Tseng, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 210 days.

(21) Appl. No.: 11/111,141

(22) Filed: Apr. 20, 2005

(65) Prior Publication Data

US 2005/0238350 A1 Oct. 27, 2005

(30) Foreign Application Priority Data

Apr. 22, 2004 (CN) .................. 2004 1 0027038

(51) Int. Cl.
*G03D 5/00* (2006.01)
(52) U.S. Cl. ..................................... 396/611
(58) Field of Classification Search ................. 396/611
See application file for complete search history.

(56) References Cited

U.S. PATENT DOCUMENTS

| 6,692,164 B2 | 2/2004 | Watanabe |
| 6,692,165 B2 * | 2/2004 | Tanaka et al. .............. 396/611 |
| 6,770,424 B2 * | 8/2004 | Mandal et al. .............. 430/311 |
| 6,777,350 B2 * | 8/2004 | Nakagawa .................. 438/782 |
| 7,018,481 B2 * | 3/2006 | Hayasaki et al. ............... 134/2 |

FOREIGN PATENT DOCUMENTS

JP 56110940 * 9/1981

* cited by examiner

*Primary Examiner*—D. Rutledge
(74) *Attorney, Agent, or Firm*—Wei Te Chung

(57) ABSTRACT

An apparatus (3) for removing developing solution from a substrate (30) includes a working table (36) for placing the substrate, a supporting frame (33) positioned on the working table, a gas dispensing nozzle (31) mounted on the supporting frame, and a water dispensing nozzle (32) mounted on the supporting frame. The apparatus can remove the residual developing solution from the substrate and needs not to lift the substrate. The substrate is safely processed and the working time is improved.

2 Claims, 3 Drawing Sheets

METHOD FOR REMOVING DEVELOPING SOLUTION

FIELD OF THE INVENTION

The present invention relates to an apparatus used in a developing process such as in photolithography, and particularly to an apparatus for removing residual developing solution after developing.

BACKGROUND

A photolithography process is often used for forming patterns on a substrate such as that used in making a liquid crystal display panel. The substrate is commonly a glass substrate, and the photolithography process generally includes a coating process, an exposing process, and a developing process. The coating process involves coating a photoresist layer on the substrate. The exposing process involves exposing the photoresist layer through a photo mask, so that patterns of the photo mask are correspondingly transferred to the photoresist layer. The developing process involves removing unwanted portions of the photoresist layer by using a developing solution, in order to obtain a patterned photoresist layer.

When the developing process is used in fabricating a thin film transistor liquid crystal display (TFT LCD), the developing solution generally is formed on the photoresist layer by relative movement between the substrate and a developing solution dispensing nozzle. After reaction of the developing solution with the unwanted portions of the photoresist layer is finished, residual developing solution is removed.

Referring to FIG. 3, this represents a conventional apparatus 1 for removing residual developing solution (not shown) from a substrate 11. The apparatus 1 includes a working table 15, and a supporting frame 14 mounted on the working table 15. The working table 15 includes a plurality of pins 12 extending up from a right top face thereof. The pins 12 can be lowered or retracted into the working table 15, and similarly can be extended back out from the working table 15. A top end of the supporting frame 14 has a dispensing nozzle 13, for dispensing developing solution onto the substrate 11 having a photoresist layer thereon. When the dispensing nozzle 13 dispenses developing solution, the pins 12 are in a lowered position or are fully retracted inside the working table 15. After reaction of the developing solution with unwanted portions of the photoresist layer is finished, the pins 12 are extended back up or out from the working table 15, thereby lifting up a right end of the substrate 11. Because the substrate 11 is inclined, residual developing solution flows off from the substrate 11 by force of gravity. Thus, the residual developing solution is removed.

However, when the substrate 11 is lifted, it is liable to be bent or even crack. In addition, the next stage in processing the substrate 11 only can be executed after the residual developing solution has flowed down from the right end thereof and off from the left end thereof. This may take an unduly long time.

Referring to FIG. 4, this represents another conventional apparatus 2 for removing residual developing solution (not shown) from a substrate 21. The apparatus 2 includes a working table 25, and a supporting frame 24 mounted on the working table 25. The working table 25 includes a low-profile, rectangular plate 22 extending up from a middle of a top face thereof. The plate 22 can be lowered or retracted into the working table 25, and similarly can be extended back out from the working table 25. A top end of the supporting frame 24 has a dispensing nozzle 23 for dispensing developing solution onto the substrate 21. When the dispensing nozzle 23 dispenses developing solution, the plate 22 is in a lowered position or is fully retracted inside the working table 25. After the reaction of the developing solution with unwanted portions of the photoresist layer is finished, the plate 22 is extended back up or out from the working table 25, thereby lifting a middle portion of the substrate 21. Because the two ends of the substrate 21 are inclined, residual developing solution flows off from the substrate 21 by force of gravity.

Because the two ends of the substrate 21 are inclined, the time needed for the developing solution to flow down and off from the substrate 21 is shorter than that needed when using the apparatus 1. However, the substrate 21 is still liable to be cracked or damaged.

What is needed, therefore, is an apparatus for removing developing solution which does not risk damage to the substrate and which provides quick processing.

SUMMARY

An apparatus for removing developing solution from a substrate includes a working table for placing the substrate, a supporting frame positioned on the working table, a gas dispensing nozzle unit mounted on the supporting frame, and a water dispensing nozzle unit mounted on the supporting frame. The apparatus can remove the residual developing solution from the substrate and needs not to lift the substrate. The substrate is safely processed and the working time is improved.

Other objects, advantages, and novel features become more apparent from the following detailed description of a preferred embodiment when taken in conjunction with the accompanying drawings, in which:

DETAILED DESCRIPTION OF PREFERRED EMBODIMENTS

Reference will now be made to the drawings to describe a preferred embodiment of the present invention in detail.

Figure 1:
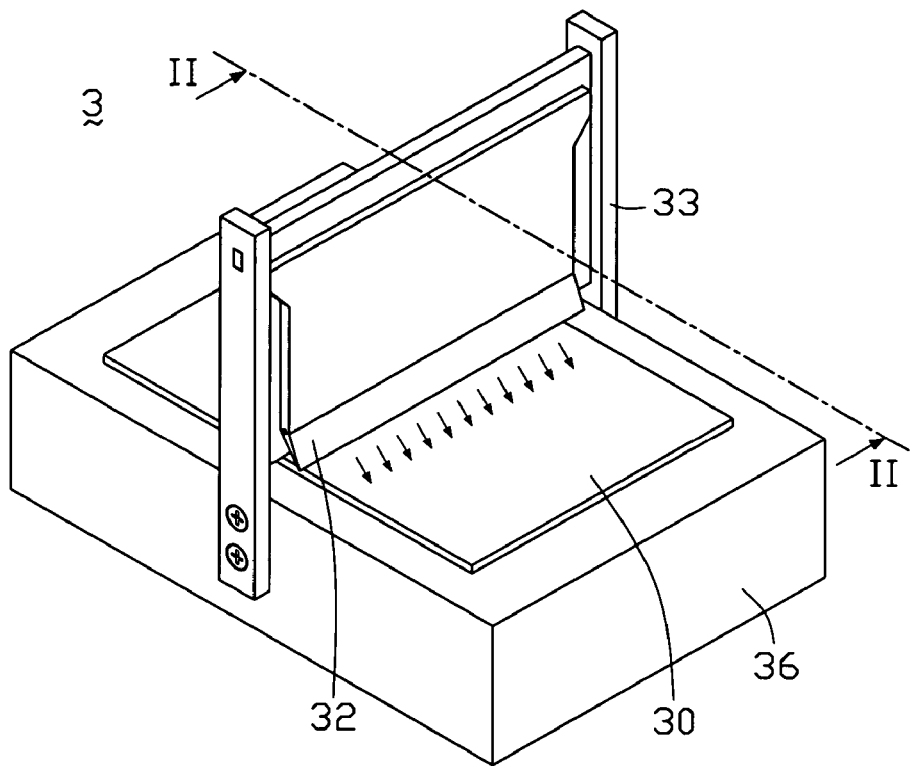
FIG. 1 is an isometric view of an apparatus for removing developing solution according to a preferred embodiment of the present invention.
Figure 2:
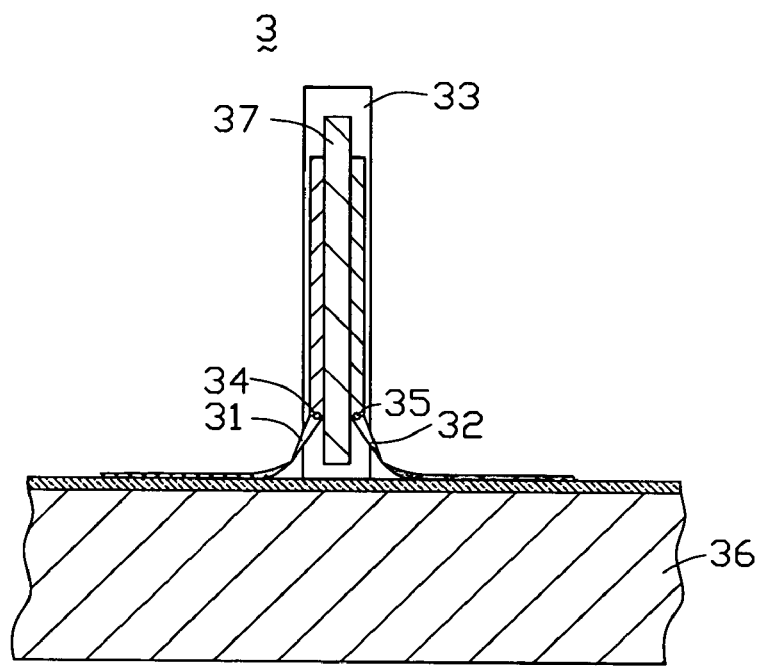
FIG. 2 is a cross-sectional view of the apparatus of FIG. 1, taken along line II-II thereof.
Figure 3:
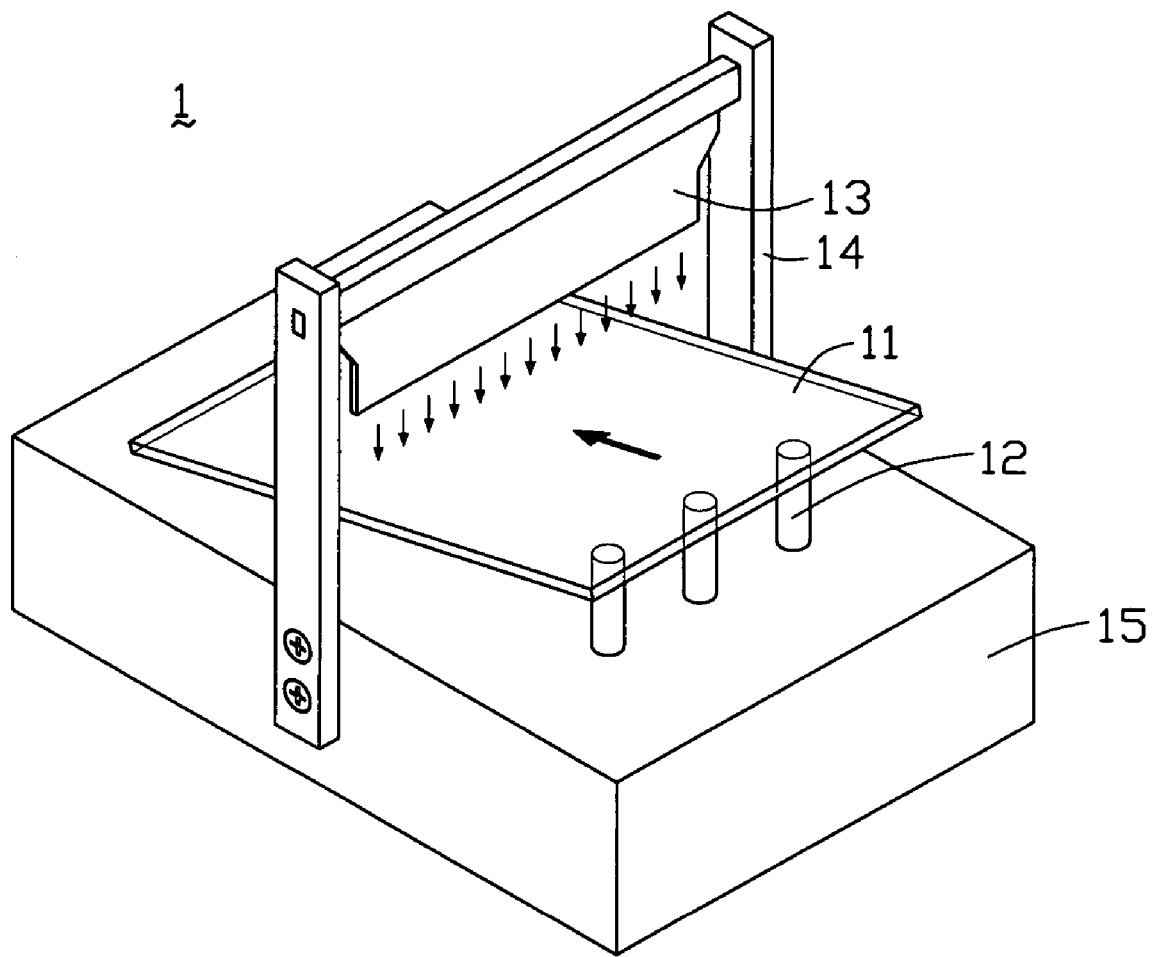
FIG. 3 is an isometric view of a first conventional apparatus for removing developing solution.
Figure 4:
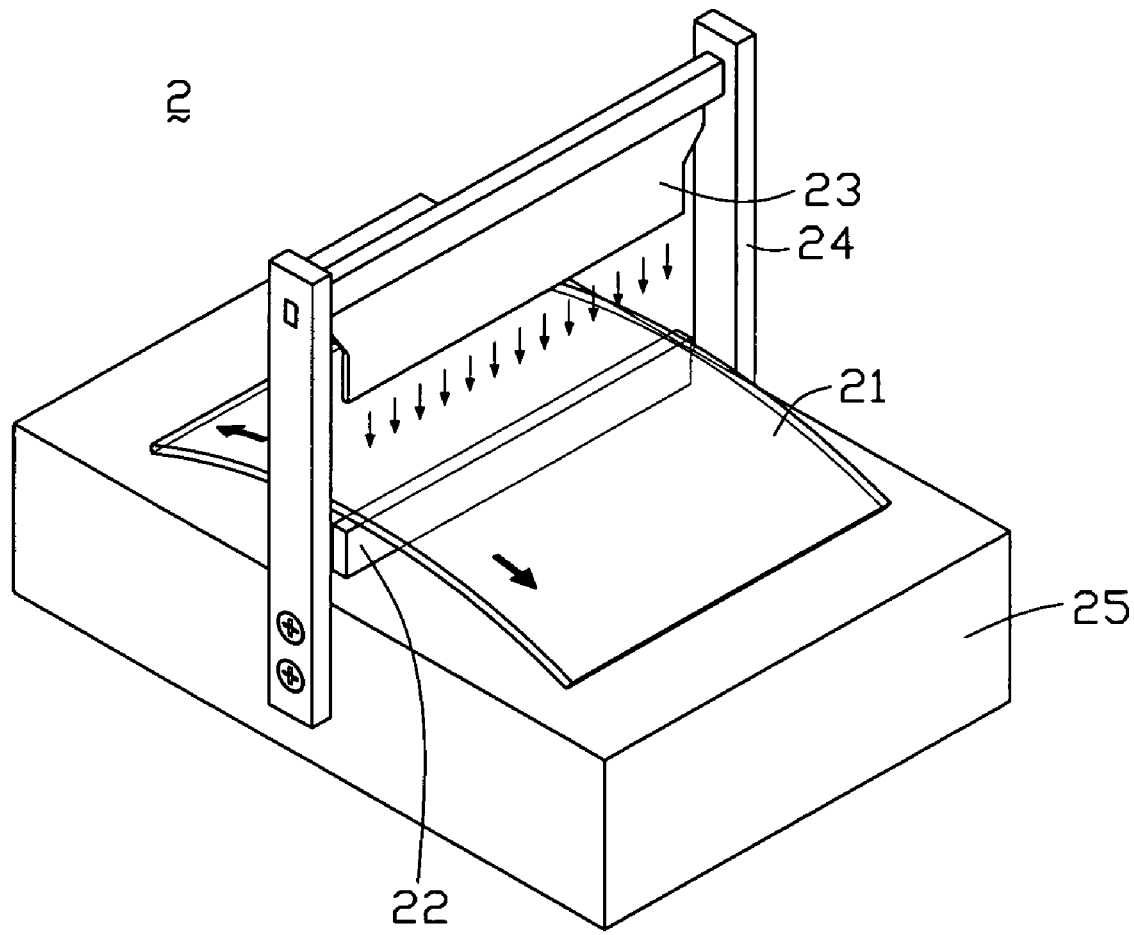
FIG. 4 is an isometric view of a second conventional apparatus for removing developing solution.

Referring to FIG. 1 and FIG. 2, an apparatus 3 for removing residual developing solution (not shown) on a substrate 30 in accordance with a preferred embodiment of the present invention includes a working table 36, a two-part supporting frame 33, a mounting plate 37, a gas dispensing nozzle 31, and a deionized water (DIW) dispensing nozzle 32.

The working table 36 is used to support the substrate 30 thereon. The two parts of the supporting frame 33 are mounted on opposite lateral sides of the working table 36 respectively. The mounting plate 37 is positioned between the two parts of the supporting frame 33. The gas dispensing nozzle 31 and the DIW dispensing nozzle 32 are mounted on two opposite sides of the mounting plate 37, respectively. The gas dispensing nozzle 31 has a pivot 34, for adjusting an angle of dispensation of gas toward the substrate 30. The DIW dispensing nozzle 32 has a pivot 35, for adjusting an angle of dispensation of DIW toward the substrate 30.

In operation, the apparatus 3 is activated to begin working after an unwanted portion of a photoresist layer (not shown) coated on the substrate 30 reacts with a developing solution (not shown). The gas dispensing nozzle 31 ejects high pressure gas onto the substrate 30 in a leftward and downward direction, and the DIW dispensing nozzle 32 ejects DIW onto the substrate 30 in a rightward and downward direction. Simultaneously, the substrate 30 is gradually moved from a left end to a right end of the working table 36. Firstly, the residual developing solution on the substrate 30 is blown off from the substrate 30. Secondly, the substrate 30 is cleaned by the DIW.

When the apparatus 3 removes the residual developing solution on the substrate 30 using the gas dispensing nozzle 31 and the DIW dispensing nozzle 32, the substrate 30 need not be lifted up. The substrate 30 is safely cleaned in this manner. In addition, there is no need to wait for the residual developing solution to flow off from the substrate 30. Therefore the processing time is shortened.

It is to be understood, however, that even though numerous characteristics and advantages of the preferred embodiment have been set forth in the foregoing description, together with details of the structure and function of the preferred embodiment, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A method for removing developing solution from a substrate, comprising the steps of:
    moving the substrate along a first direction;
    ejecting high pressure gas to the substrate in a second direction, the second direction having a component opposite to the first direction; and
    ejecting water to the substrate in a third direction, the third direction having a component the same as the first direction.

2. The method as recited in claim 1, wherein the water is deionized water (DIW).

* * * * *